United States Patent
Jasa et al.

(10) Patent No.: US 6,909,329 B2
(45) Date of Patent: Jun. 21, 2005

(54) ADAPTIVE LOOP BANDWIDTH CIRCUIT FOR A PLL

(75) Inventors: Hrvoje Jasa, Scarborough, ME (US); Gary D. Polhemus, Sebago, ME (US)

(73) Assignee: Agere Systems Inc., Allentown, PA (US)

(*) Notice: Subject to any disclaimer, the term of this patent is extended or adjusted under 35 U.S.C. 154(b) by 101 days.

(21) Appl. No.: 10/653,630

(22) Filed: Sep. 2, 2003

(65) Prior Publication Data

US 2005/0046490 A1 Mar. 3, 2005

(51) Int. Cl.[7] .......................... H03L 7/085; H03L 7/091
(52) U.S. Cl. ........................ 331/1 A; 331/11; 331/17; 331/25; 327/12; 327/157; 327/159
(58) Field of Search ..................... 331/1 A, 10–12, 331/17, 25; 327/12, 156–159; 332/127; 360/51; 375/376; 455/260

(56) References Cited

U.S. PATENT DOCUMENTS 5,301,196 A * 4/1994 Ewen et al. ................ 370/518
6,041,090 A * 3/2000 Chen .......................... 375/376

OTHER PUBLICATIONS

Joseph Adler, "Clock–source jitter: A clear understanding aids oscillator selection"; EDN, Feb. 18, 1999, pps. 79–86.

* cited by examiner

Primary Examiner—David Mis (57) ABSTRACT

A phase-locked loop (PLL) employs a phase detector (PD) generating an up/down signal based on the phase error between a data signal and a clock signal input to the phase detector. The PD senses excess jitter and extends the loop bandwidth to accommodate such excess jitter. Phase error is derived by sampling of the clock signal and at least one phase-shifted version of the clock signal by the data signal, and a retimed data is generated by the PD by sampling of the data signal by the clock signal. The sampled clocks are employed to generate a modified control signal with greater resolution in detecting the phase error, which, in turn, increases the loop bandwidth.

16 Claims, 5 Drawing Sheets

PHASE DETECTOR GAIN

ADAPTIVE LOOP BANDWIDTH CIRCUIT FOR A PLL

BACKGROUND OF THE INVENTION

1. Field of the Invention

The present invention relates to phase-locked loop (PLL) circuits, and, more particularly, to adaptive loop bandwidth circuits for a PLL.

2. Description of the Related Art

A phase-locked loop (PLL) is a circuit that generates, or synthesizes, a periodic output signal that has a constant phase and frequency with respect to a periodic input signal. PLLs are widely used in many types of measurement, microprocessor, and communication applications. One type of phase-locked loop is the charge-pump PLL, which is described in Floyd M. Gardner, "Charge-Pump Phase-Lock Loops" *IEEE Trans. Commun.*, vol. COM-28, pp. 1849–1858, November 1980, the teachings of which are incorporated herein by reference.

In a conventional charge-pump phase-locked loop, a phase detector (PD) compares the phase $\theta_{IN}$ of the input signal to the phase $\theta_{OUT}$ of a feedback signal derived from the PLL output. Based on the comparison, the PD generates an error signal: either an UP signal (when $\theta_{IN}$ leads $\theta_{OUT}$) or a DOWN signal (when $\theta_{OUT}$ leads $\theta_{IN}$), where the error signal indicates the magnitude of the difference between $\theta_{IN}$ and $\theta_{OUT}$. A charge pump generates an amount of charge equivalent to the error signal from the PD, where the sign of that charge indicates the direction of UP or DOWN. Depending on whether the error signal was an UP signal or a DOWN signal, the charge is either added to or subtracted from the one or more capacitors in a loop filter. The loop filter may have a relatively simple design, comprising a capacitor $C_S$ in parallel with the series combination of a resistor R and a relatively large capacitor $C_L$. As such, the loop filter operates as an integrator that accumulates the net charge from the charge pump. The resulting loop-filter voltage $V_{LF}$ is applied to a voltage-controlled oscillator (VCO). A voltage-controlled oscillator is a device that generates a periodic output signal, whose frequency is a function of the VCO input voltage. Input and feedback dividers may be placed in the input and feedback paths, respectively, if the frequency of the output signal is to be either a fraction or a multiple of the frequency of the input signal.

In digital data applications in which a locally generated clock is synchronized to input data, one type of PLL is implemented with a PD that observes discrete periods, or snapshots, of the phase error between the input data and the clock. The clock phase correction is based solely on the polarity, or direction, of the phase offset. This type of PD is sometimes referred to as a "bang-bang" PD. A bang-bang PD samples the phase error of the input data in the following way: one sample is taken near the optimal sampling point, termed the center of the eye, and a sample is also taken at or near the transition point where the data switches to a new logic level, termed the edge transition. PLLs with bang-bang PDs are only nearly "locked" to the input data and form non-linear systems that make analysis difficult.

If the sampled data is different from the value sampled during the prior edge transition (termed a prior "edge transition sample"), then the edge transition sample is made before the data changes to a new value. In this case, the system clock is leading, and the PD generates a DOWN signal to decrease the speed, or frequency, of the clock. Similarly, if the sampled data is different from the next edge transition sample, then the system clock is lagging, and the PD generates an UP signal to increase the frequency of the clock. However, bang-bang PDs may introduce excessive jitter in the resulting clock signal since the clock is shrunk or expanded at every edge transition.

SUMMARY OF THE INVENTION

The present invention relates to a phase-locked loop (PLL) circuit that employs a phase detector (PD) generating an up/down signal based on the phase error between a data signal and a clock signal input to the phase detector. The PD senses excess jitter and extends the loop bandwidth to accommodate such excess jitter. Phase error is derived by sampling of the clock signal and at least one phase-shifted version of the clock signal by the data signal, and a retimed data is generated by the PD by sampling of the data signal by the clock signal. The sampled clocks are employed to generate a modified control signal with greater resolution in detecting the phase error, which, in turn, increases the loop bandwidth.

In accordance with exemplary embodiments of the present invention, a PLL includes a phase detector (PD), a first charge pump, and a voltage-controlled oscillator (VCO). The phase detector generates an up/down signal based on a phase difference between a data signal, a clock signal, and one or more phase-shifted clock signals input to the PD, wherein the phase difference is generated by sampling each clock signal by the data signal and a level of the up/down signal is based on the phase difference. The first charge pump generates a feedback voltage from the up/down signal. The VCO generates the clock signal based upon the feedback voltage.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
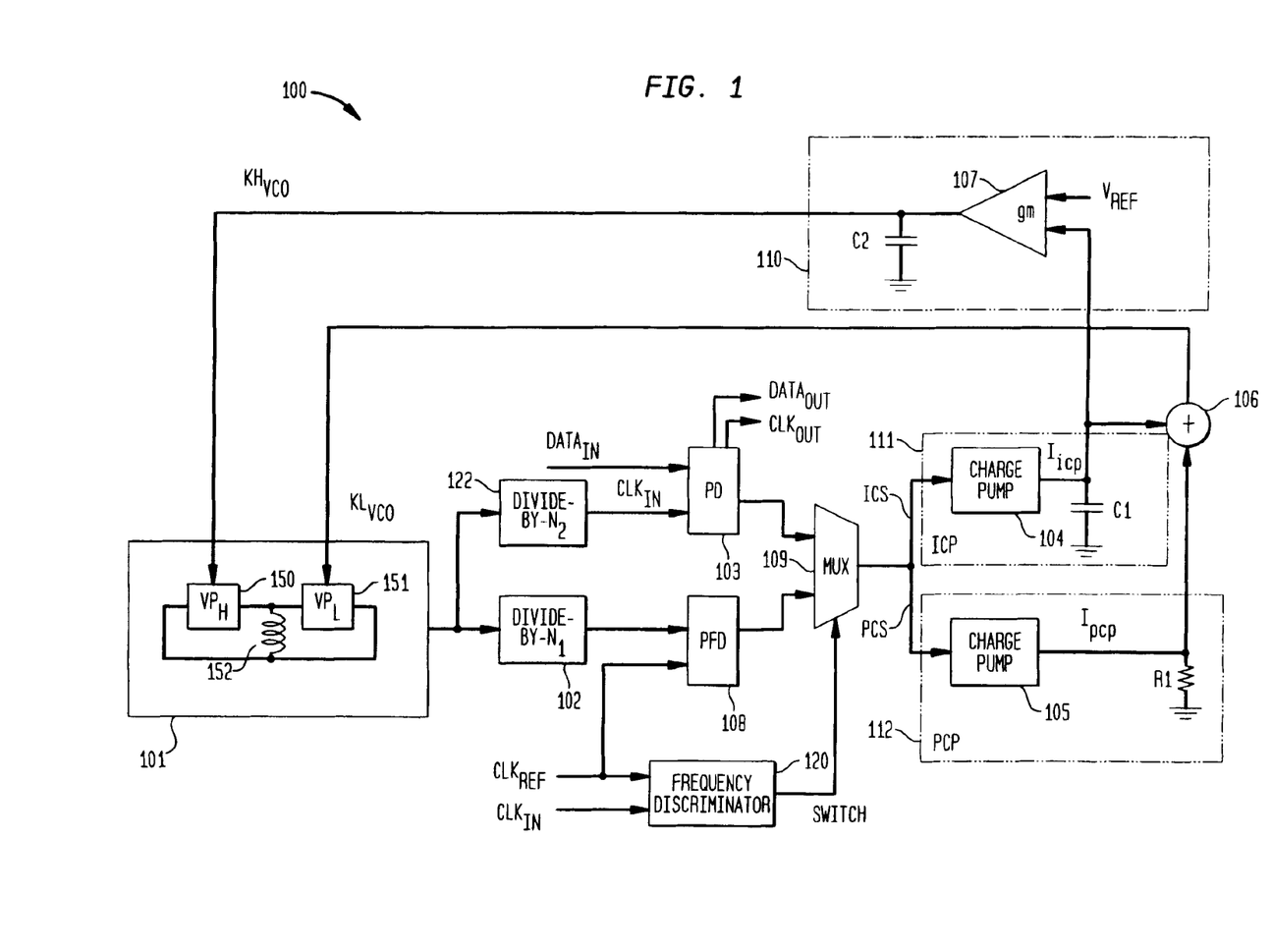
FIG. 1 shows a block diagram of a phase-locked loop operating in accordance with an exemplary embodiment of the present invention.

FIG. 1 shows a block diagram of phase-locked loop (PLL) 100 operating in accordance with an exemplary embodiment of the present invention. PLL 100 comprises voltage controlled oscillator (VCO) 101, divide-by-$N_1$ 102, divide-by-$N_2$ 122, phase detector (PD) 103, integral charge pump (ICP) 111 having charge pump 104 and capacitor C1, proportional charge pump (PCP) 112 having charge pump 105 and resistor R1, voltage adder 106, and process/voltage/temperature (PVT) compensator 110 including amplifier 107 and capacitor C2. Though not explicitly shown in FIG. 1, charge pumps 104 and 105 are coupled to a common ground and biased with a reference voltage $V_{ref}$. PLL 100 tends to synchronize the frequency of the signal provided by VCO 101 to a frequency that is a multiple of the frequency of the input data $DATA_{in}$.

VCO 101 is shown as being implemented as an inductor-capacitor (LC) oscillator having a fixed inductor value and a variable capacitor value. The variable capacitor value may be implemented with two pairs of tunable varactors, each varactor pair having a capacitance tuned by an input voltage. One varactor pair sets the dominant, or "large" capacitance, while the other varactor pair sets the minor, or "low" capacitance. For the exemplary embodiment shown in FIG. 1, VCO 101 receives two control voltages, $KL_{vco}$ and $KH_{vco}$. As shown in FIG. 1, inductor 152 is in parallel with varactor pair $VP_H$ 150 controlled by $KH_{vco}$ and varactor pair $VP_L$ 151 controlled by $KL_{vco}$. Each of the two control voltages, $KL_{vco}$ and $KH_{vco}$, sets a capacitance of a corresponding varactor pair. The control voltage $KH_{vco}$ adjusts the large capacitance, while the control voltage $KL_{vco}$ adjusts the low capacitance. Other types of VCOs well-known in the art, such as crystal oscillator or ring-type VCOs, might be employed for VCO 101.

Control voltage $KH_{vco}$ is set by an outer feedback loop comprising PVT compensator 110 including amplifier 107 with transconductance gain gm and capacitor C2. PVT compensator 110 is employed to compensate for variations in operation caused by variations in process (such as semiconductor processes, voltage (such as in power supply), and temperature. Amplifier 107 receives a reference voltage $V_{ref}$ to set a nominal operating frequency of VCO 101. In addition, amplifier 107 receives the voltage appearing across C1, which voltage is a function of the current $I_{icp}$ from charge pump 104. Effects of PVT variations of PLL 100 in the frequency of VCO 101 are exhibited at the voltage across C1, since the average DC voltage across C1. Variations in voltage across C1 are adjusted by (gm/C2) by PVT compensator 110 and applied to VCO 101 so as to minimize effects of the variations. Control voltage $KL_{vco}$ is set by an inner feedback loop as described subsequently.

Divide-by-$N_2$ 122 divides the output signal frequency of VCO 101 by $N_2$, $N_2$ being a positive number, to generate the clock $CLK_{in}$. For a bang-bang PD, $CLK_{in}$ may be generated so as to have a frequency that is twice the frequency of the input data $DATA_{in}$. Divide-by-$N_2$ 122 may be implemented with a counter that counts by $N_2$. Other dividers, such as fractional dividers, may also be employed for divide-by-$N_2$ 122.

Figure 2:
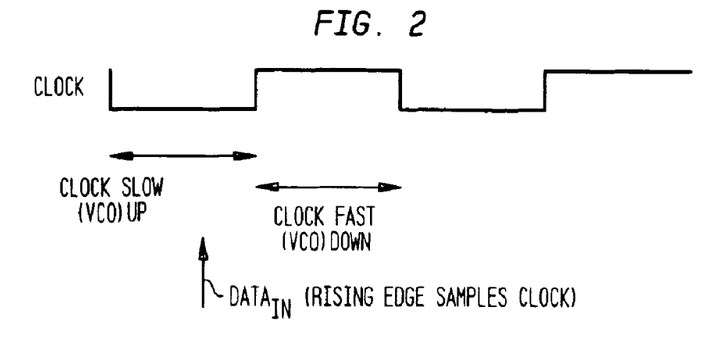
FIG. 2 shows a relation between the input data and the input clock of the phase detector of FIG. 1.
Figure 3:
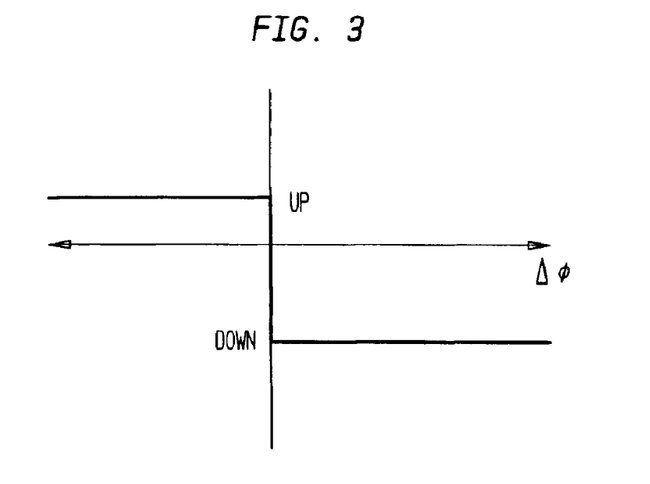
FIG. 3 shows the control signal generated by the phase detector of FIG. 1.

PD 103 is desirably implemented as a bang-bang phase detector, in which the input data $DATA_{in}$ is employed to determine when to sample the input clock $CLK_{in}$. As shown in FIG. 2, for the described exemplary embodiment, the rising edge of $DATA_{in}$ samples the clock $CLK_{in}$ for detection of the phase difference $\Delta\phi$ between $DATA_{in}$ and $CLK_{in}$. Based on the detected phase difference $\Delta\phi$ between $DATA_{in}$ and $CLK_{in}$, PD 103 generates an UP signal when the frequency of $CLK_{in}$ is too slow and generates a DOWN signal when the frequency of $CLK_{in}$ is too fast, as shown in FIG. 3. The falling edge of $CLK_{in}$ is employed to sample the data value of $DATA_{in}$ to generate retimed output data $DATA_{out}$, as described subsequently with respect to FIG. 4.

Figure 4:
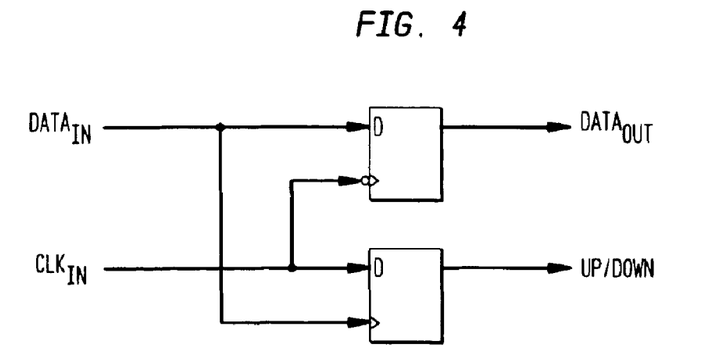
FIG. 4 shows an exemplary embodiment of the phase detector of FIG. 1.

FIG. 4 shows an exemplary embodiment of PD 103 of FIG. 1. PD 103 comprises two D flip-flops 401 and 402. D flip-flop 402 receives the input clock $CLK_{in}$ and is clocked by the rising edge of input data $DATA_{in}$. Thus, D flip-flop 402 samples $CLK_{in}$ with $DATA_{in}$ generate the UP/DOWN signal. D flip-flop 401 receives the input data $DATA_{in}$ and is clocked by the rising edge of the complement of $CLK_{in}$. The rising edge of the complement of $CLK_{in}$ corresponds to the falling edge of $CLK_{in}$, which complement of $CLK_{in}$ may be provided as the output clock $CLK_{out}$, shown in FIG. 1. Thus, D flip-flop 401 samples $DATA_{in}$ to generate re-timed output data $DATA_{out}$. One skilled in the art might employ other types of bang-bang phase detector known in the art for PD 103.

Operation of the inner feedback loop to set control voltage $KL_{vco}$ is now described. Returning to FIG. 1, the UP/DOWN signal from PD 103 is applied to ICP 111 and PCP 112 (multiplexer 109 is optional, as described subsequently, and for the following discussion the output of PD 103 is directly coupled to ICP 111 and PCP 112). The UP/DOWN signal from PD 103 is provided as a proportional control signal PCS to charge pump 105 and is provided as an integral control signal ICS to charge pump 104. The proportional control signal might be a non-return-to-zero (NRZ) signal, and the integral control signal might be a truncated version of the NRZ control signal, such as a return-to-zero (RZ) control signal.

Charge pump 104 steers current $I_{icp}$ to capacitor C1, where charge pump 104 steers current $I_{icp}$ up or down based on the integral control signal ICS from PD 103. Similarly, charge pump 105 steers current $I_{pcp}$ to resistor R1, where charge pump 105 steers current $I_{pcp}$ up or down based on the proportional control signal PCS from PD 103. Here, "steering" current refers to adding or subtracting charge with positive or negative current direction. Voltages across ICP 111 and PCP 112 (i.e., voltages $V_{int}$ and $V_{prop}$ across C1 and R1, respectively) are combined by voltage adder 106 to generate by $KL_{vco}$. The voltage $V_{prop}$ sets the bang-bang frequency $\pm\Delta F_{bb}$ of the inner loop, which are the bounds of the frequency variation of the inner loop. The voltage $V_{int}$ sets the base, or center, frequency of the inner loop.

The voltages $V_{prop}$ and $V_{int}$ may be as given in equations (1) and (2):

$$V_{prop} = I_{pcp} * R1 \quad (1)$$

$$V_{int} = (I_{icp}\Delta t / C1) \quad (2)$$

where $\Delta t$ is an increment of time based on the sampling period of PD 103 and is truncated for the integral path. An associated system stability $\zeta$ is as given in equation (3):

$$\zeta \propto \frac{V_{prop}}{V_{int}} = \frac{I_{pcp}}{(I_{icp}\Delta t / C1)} = \frac{I_{pcp}}{I_{icp}\Delta t} R1C1 \quad (3)$$

Consequently, the system stability $\zeta$ increases as the ratio of $V_{prop}$ to $V_{int}$ increases.

The combination of the two voltages $V_{prop}$ and $V_{int}$ from voltage adder 106 drives VCO 101 into phaselock. For some embodiments of the present invention, C1 might be formed in an integrated circuit (IC), and so the inner loop is desirably stable for all operating frequencies of PLL 100. The inventors have determined that the higher the ratio of $V_{prop}$ to $V_{int}$, the more stable the inner loop of PLL 100. If capacitor C1 were an external component of an IC, capacitor C1 might be set is large as is required for a given implementation in order to satisfy the stability requirement, but if capacitor C1 is formed in an IC, limits might be imposed on the value of C1.

Employing ICP 111 and PCP 112 (i.e., employing separate charge pumps) allows for capacitance multiplication. Capacitance multiplication is a characteristic of a circuit that makes a capacitance value appear to be larger than the actual capacitance of a circuit component. Two charge pumps allow for preservation of the ratio $V_{prop}$ to $V_{int}$ by reducing either i) $I_{icp}$, ii) $\Delta t$, or iii) a combination of these values, thus allowing for operation of PLL 100 that may otherwise require larger values of capacitance for C1.

A bang-bang phase detector is a non-linear system because the feedback phase error is non-linear, resulting in a non-linear loop, and so the phase response of the system has a slew-limited nature. Any applied jitter to an input signal of the system is tracked up to the stewing point of the loop. For a very small level of applied jitter, the loop will track the jitter so as to appear as a very wide-band loop. The 3-dB loop bandwidth $F_{3dB}$ is inversely proportional to the applied jitter $JT_{in}$, as given in equation (4):

$$F_{3dB} \propto (\Delta F_{bb}/JT_{in}) \qquad (4)$$

Returning to FIG. 1, PLL 100 might operate during periods in which no data is present (i.e., when the signal $DATA_{in}$ doesn't exist). Consequently, PLL 100 may monitor the output signal frequency of VCO 101 and to provide inner loop control voltages $KH_{vco}$ and $KL_{vco}$ that maintain the signal frequency of VCO 101 within a predefined set of frequency bounds. Optionally, PLL 100 further comprises phase-frequency detector (PFD) 108, divide-by $N_1$ 102, frequency discriminator 120, and MUX 109.

Frequency discriminator 120 receives both $CLK_{in}$ and the reference clock $CLK_{ref}$. For example, frequency discriminator 120 may monitor $CLK_{in}$ and $CLK_{ref}$ and declare a loss of frequency lock when the difference between the input clock signals is greater than a predefined amount, such as 400 parts-per-million (PPM) in systems following SONET standards. Implementations of frequency discriminators for frequency discriminator 120 are well-known in the art. When frequency discriminator 120 declares a loss of synchronization, frequency discriminator 120 may generate a signal SWITCH to MUX 109 to switch the input of ICP 111 and PCP 112 from the output of PD 103 to the output of PFD 108.

Divide-by $N_1$ 102 divides the output of VCO 101 by $N_1$, where $N_1$ is a positive number. PFD 108 operates as a phase detector in a similar manner to that described above with respect to PD 103, and PFD 108 generates an up/down signal based on a detected phase error between the output of divide-by $N_1$ 102 and a reference clock $CLK_{ref}$ at a predefined reference frequency.

The values of $N_1$ and $N_2$ for divide-by $N_1$ 102 and divide-by $N_2$ 102, respectively, might be determined based on the particular implementation of PLL 100. The value for $N_1$ is set based on the ratio of VCO output signal frequency to reference clock frequency, and the value for $N_2$ is set by the ratio of data signal frequency to reference clock frequency. For operation in accordance with the SONET standard, the reference clock frequency set as 155.52 MHz, and the VCO output signal frequency set as 2.48832 MHz, the values for $N_1$ and $N_2$ for varying data rates are as given in Table 1.

TABLE 1

| Data Frequency | $N_1$ | $N_2$ |
|---|---|---|
| 2.48832 MHz | 16 | 1 |
| 622.08 MHz | 16 | 4 |
| 155.52 MHz | 16 | 16 |

Some exemplary embodiments of the present invention might be employed for terminal equipment of a communications system operating in accordance with a SONET standard. For example, for a transmission terminal operating in accordance with a SONET standard, a recovered clock from a received signal is employed as the timing/synchronization source of the transmitter clock, hence a jitter transfer pole of that SONET standard is desirably adhered to. Such transmission terminal might employ an exemplary implementation of the present invention to generate a clock signal synchronized to input data received by the terminal. The specification for the jitter transfer pole of a SONET OC48 is 2 MHz. The $JT_{in}$ bound is chosen by a tolerance mask value of the SONET standard as 0.15 $UI_{p-p}$ (where p-p indicates peak-to-peak and UI indicates unit interval). From equation (4), the bang-bang frequency $\Delta F_{bb}$ where the onset of slew limiting occurs is 600 kHz.

For this example, the gain of the VCO should be relatively low, otherwise very small currents $I_{pcp}$ and $I_{icp}$, or a small value of R1, is required to generate this 600 kHz bang-bang frequency. When the loop is locked, the generated jitter $JT_{out}$ is desirably less than 0.1 $UI_{p-p}$. A value of $KL_{vco}$ for the given example might be selected as 40 MHz/V, if the total variation of the varactor pairs in the VCO is 500 MHz/V and the varactor pairs are a first pair having variation of 460 MHZ/V controlled by $KH_{vco}$ and a second pair having variation of 40 MHz/V controlled by $KL_{vco}$. For these pairs of varactors, R1 is set as 1875 $\Omega$ and $I_{pcp}$ is set as 5 $\mu A$. This gives a bang-bang frequency of 375 kHz, and a transfer bandwidth of 1.25 MHz.

Employing proportional and integral control signals to generate the voltages $V_{prop}$ to $V_{int}$ in accordance with the present invention allows for capacitance multiplication, as described subsequently. For example, the stability of the system used for the SONET OC48 and OC12 standards might be analyzed using a behavioral model of the loop in the frequency/phase domain. Employing non-return-to-zero (NRZ) charge pumps for charge pumps 104 and 105 to receive the UP/DOWN signal from the bang-bang phase detector PD 103 (which is equivalent to using only proportional control signals for both charge pumps), and applying input data $DATA_{in}$ as a length $2^{23}-1$ pseudo-random bit sequence (PRBS), no instability might be observed. However, for the SONET OC3 standard, periods of instability might be observed.

To stabilize the loop of PLL 100, such as for exemplary implementations for the SONET OC3 standard, the ratio of $V_{prop}$ to $V_{int}$ is examined. If the loop is designed so that the UP/DOWN signals are NRZ, the loop is at either plus or minus the bang frequency until the next sample of phase difference is initiated. As shown in equation (3), the ratio of $V_{prop}$ to $V_{int}$ indicates system stability, and the ratio of $V_{prop}$ to $V_{int}$ is desirably maintained as much greater than 1.

From equation (3), as the $\Delta t$ value decreases, the ratio of $V_{prop}$ to $V_{int}$ increases. The $\Delta t$ value is inversely proportional to the data rate, since the $\Delta t$ value is related to the sampling period between the input data $DATA_{in}$ and input clock $CLK_{in}$. For an OC3 data rate this sampling period is 16 times longer than the sampling period for an OC48 data rate, as the baud rate is directly related to the NRZ time. To make the ratio of $V_{prop}$ to $V_{int}$ the same for both OC48 and OC3, as described previously, the charge pump of ICP 111 employs an integrated control signal ICS, and thus ICP 111 is selected as an RZ (return-to-zero) charge pump, limiting (reducing) the value of the $\Delta t$ term in the relationship. Reducing the $\Delta t$ term has the same effect as increasing (or "multiplying") the capacitance C1.

Figure 5:
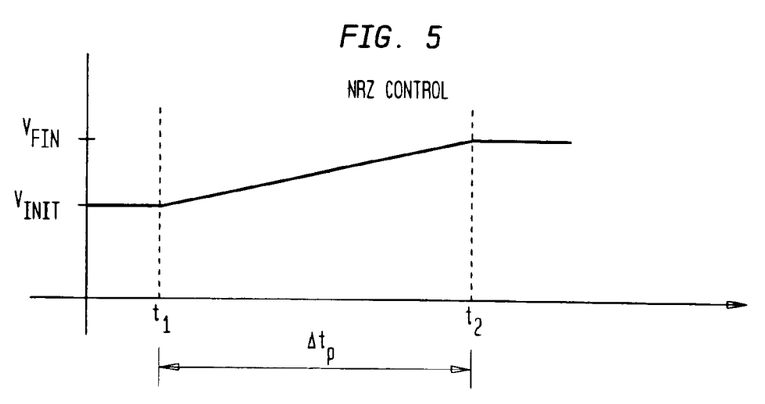
FIG. 5 shows the characteristics of a sampled non-return-to-zero charge pump.
Figure 6:
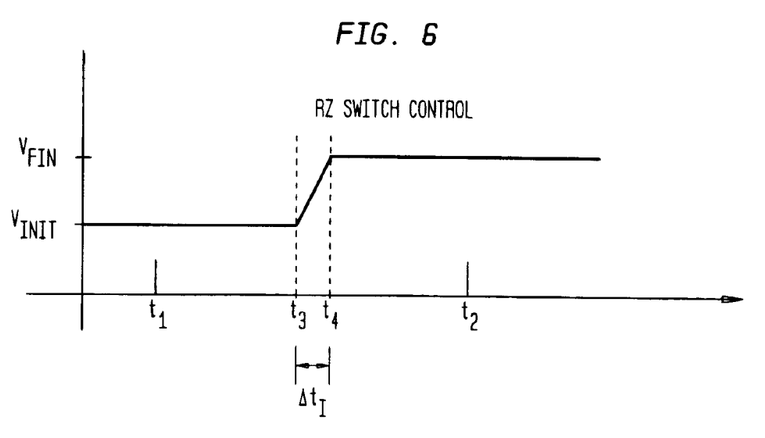
FIG. 6 shows the characteristics of a sampled return-to-zero charge pump that may be employed for the integral charge pump of FIG. 1.

FIGS. 5 and 6 illustrate the difference between operation of charge pumps 111 and 112 when the integral and proportional control signals ICS and PCS are applied. FIG. 5 shows the characteristics of the sampled NRZ charge pump that may be employed for PCP 112, and FIG. 6 shows the characteristics of the sampled RZ charge pump that may be employed for ICP 111. For both FIGS. 5 and 6, the start and end of the correction cycle points are $t_1$ and $t_2$. Thus, in FIG. 5, an NRZ control signal (across, for example, C1) yields a $\Delta t_p$ term for the voltage to change from $V_{INIT}$ to $V_{FIN}$. As shown in FIG. 6, the charge from the charge pump is delivered to the integration capacitor C1 for a finite amount of time between $t_1$ and $t_2$, which yields a $\Delta t_1$ term for the voltage to change from $V_{INIT}$ to $V_{FIN}$ that is much less than the $\Delta t_p$ term. Thus, employing the truncated proportional control signal instead of the proportional control signal over the entire correction cycle as in the NRZ charge pump of FIG. 5 reduces the time that C1 charges. Reducing the time that C1 charges lowers the value of $V_{int}$, thereby increasing the ratio of $V_{prop}$ to $V_{int}$ to stabilize the loop.

A non-linear PLL exhibits a property that the bandwidth of the loop is proportional to the applied input jitter. However, setting the limit of the loop bandwidth based on a particular input jitter point, as described above with respect to the exemplary SONET loop stability, might not provide additional gain for excess jitter. Consequently, an alternative embodiment of the present invention employs a modified phase detector for PD 103 that senses excess jitter and extends the loop bandwidth to accommodate such excess jitter. Such modified phase detector generates an additional, phase-shifted version of the input clock which is also sampled by the input data. The two sampled clocks are employed to generate a modified UP/DOWN signal with greater resolution in detecting the phase error, which, in turn, increases the loop bandwidth by detecting and compensating for excess jitter more rapidly than the PD shown and described above for FIGS. 2, 3, and 4.

Figure 7:
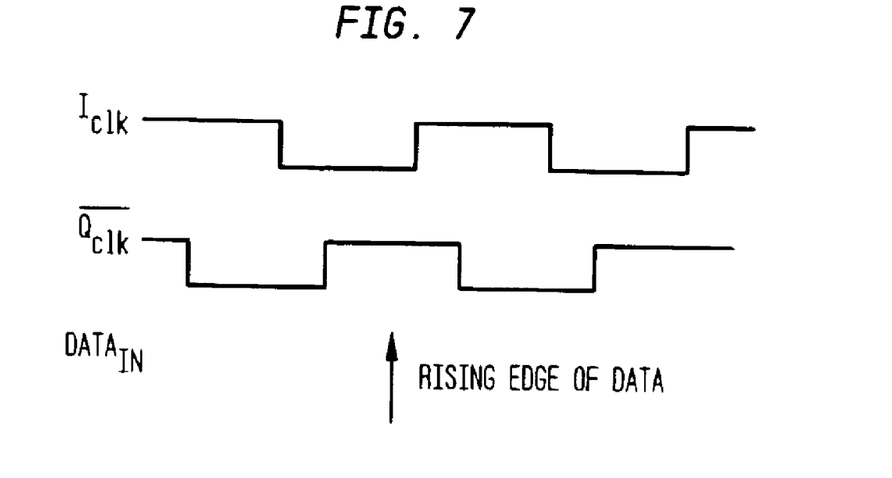
FIG. 7 shows a relation between the input data, the input clock, and a phase shifted version of the input clock for an alternative embodiment of the phase detector of FIG. 1 that modifies loop bandwidth in accordance with an exemplary embodiment of the present invention.
Figure 8:
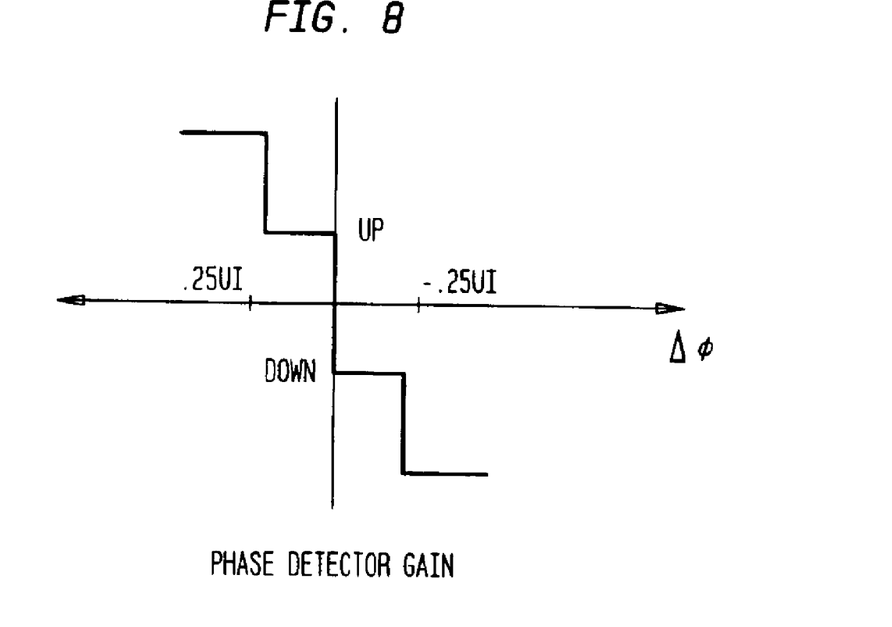
FIG. 8 shows the control signal generated by an alternative embodiment of the phase detector of FIG. 1.

FIG. 7 shows a relation between the input data $DATA_{IN}$, the input clock $CLK_{IN}$ (shown as equivalent to the baseline or "in-phase" clock Iclk), and a 90-degree phase-shifted version of the input clock $\overline{Qclk}$. $\overline{Qclk}$ is the complement of the 90-degree delayed (or "quadrature") version Qclk of the input clock signal Iclk, and $\overline{Qclk}$ leads Iclk by 90 degrees. Sampling of Iclk by the leading edge of the input data indicates whether the input clock $CLK_{IN}$ leads or lags the input data by at most 180 degrees of phase shift, and sampling of $\overline{Qclk}$ by the input data indicates whether the leading or lagging input clock $CLK_{IN}$ is leading or lagging by more or less than 90 degrees of phase shift, allowing for an identification of the phase error between the data and input clock to within 0.25 UI of the data rate. FIG. 8 shows the UP/DOWN control signal generated by an alternative embodiment of the phase detector of FIG. 1 that employs the in-phase and complemented quadrature phase of the input clock. As shown in FIG. 8, the magnitude of the UP/DOWN signal depends on the degree of phase, allowing the modified UP/DOWN signal to modify the currents $I_{icp}$ and $I_{pcp}$ accordingly.

Figure 9:
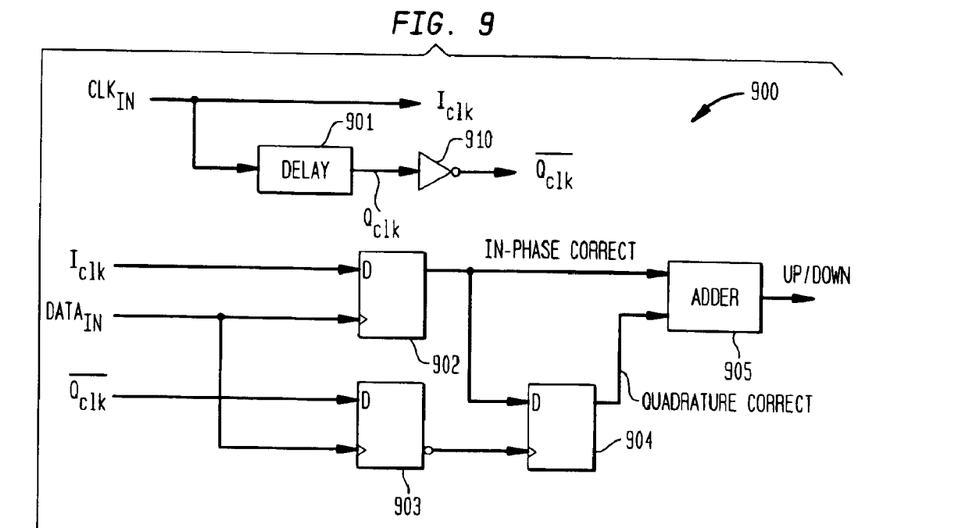
FIG. 9 shows an alternative embodiment of the phase detector of FIG. 1.

FIG. 9 shows an alternative embodiment 900 of the phase detector of FIG. 1 that may be employed to generate the UP/DOWN signal of FIG. 8 in accordance with the exemplary clock signals of FIG. 7. PD 900 comprises delay 901, inverter 910, D flip-flops 902, 903, and 904, and adder 905. $CLK_{IN}$ is provided as Iclk and is also provided to delay 901. Delay 901 delays $CLK_{IN}$ by 90 degrees with respect to Iclk to provide Qclk. Qclk is applied to inverter 910, which generates the signal $\overline{Qclk}$ that leads Iclk by 90 degrees.

D flip-flop 902 generates an in-phase correct signal by sampling Iclk with $DATA_{IN}$. Similarly, D flip-flop 903 samples $\overline{Qclk}$ with $DATA_{IN}$. The output of D flip-flop 903 is inverted and applied to D flip-flop 904 to sample the in-phase correct signal. When the rising edge of the input data signal $DATA_{IN}$ leads or lags Iclk, if the lead or lag passes the falling edge transition of $\overline{Qclk}$ (which is the rising edge of the inverted output of D flip-flop 904), then the phase error is greater than 0.25 UI. When phase error is greater than 0.25 UI, the output of D flip-flop 903 transitions to a logic high state, which passes in-phase correct signal through D flip-flop 904 as a quadrature phase correct signal. When phase error is less than 0.25 UI, the output of D flip-flop 903 transitions to a logic low state, which resets D flip-flop 904 and passes the logic low signal as the quadrature phase correct signal.

Adder 905 receives in-phase and quadrature correct signals. In-phase and quadrature correct signals are combined by adder 905 to form the UP/DOWN signal. When phase error is greater than 0.25 UI, the magnitude of the UP/DOWN signal is relatively large, and when phase error is less than 0.25 UI, the magnitude of the UP/DOWN signal is relatively small. The magnitude of the correction necessary to pull the PLL loop in lock is proportional to the magnitude of the UP/DOWN signal. Adder 905 may be implemented as a charge pump receiving the quadrature correct signal and coupled in parallel with ICP 111 and PCP 112, which receive the in-phase correct signal.

Figure 10:
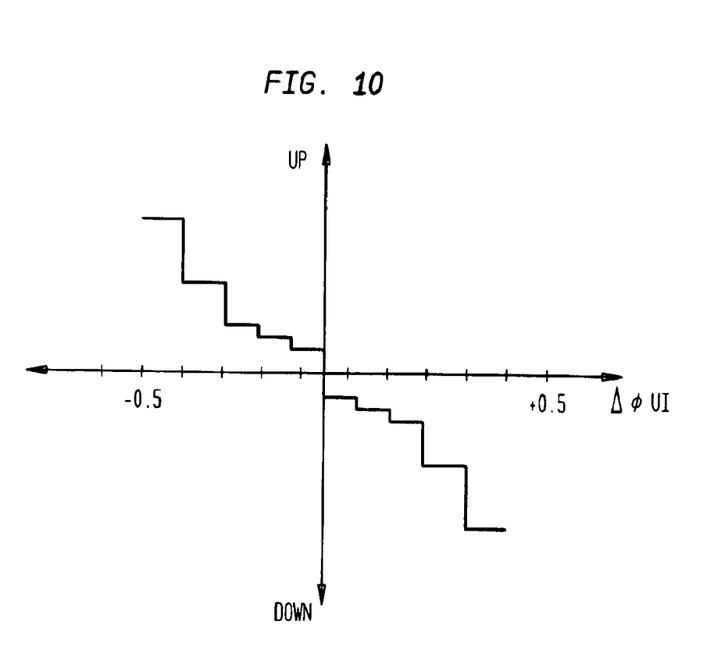
FIG. 10 shows the control signal generated by a phase detector used for the PLL of FIG. 1 when multiple input clock phases are employed to sample the input data.

One skilled in the art may extend the exemplary embodiment of FIGS. 7, 8, and 9 to generate additional phase-shifted versions of the input clock signal to allow for greater accuracy in determining the phase error between the input clock and the input data. In addition, the delay between the different phase-shifted versions of the input clock need not be equivalent. Greater granularity might also allow for a variation in quantizing for the level of the UP/DOWN signal corresponding to the detected phase error. Thus, the greater the phase error, such as when a jitter "spike" occurs, an even greater level for the UP/DOWN signal might be employed to return the phase error to near lock faster. FIG. 10 shows the control signal generated when i) multiple input clock phases are employed to sample the input data and ii) varying quantizing levels are employed for the UP/DOWN signal.

While the present invention has been described with respect to PLLs, the present invention is not so limited. The teachings of the present invention may be extended to delay-locked loops and similar applications. In addition, while the present invention has been described with respect to an LC oscillator, the present invention is not so limited. The teachings of the present invention may be extended to any oscillator, such as a crystal or ring-type oscillator, employed for a PLL or similar type of circuit.

The present invention may allow for the following advantages. A given implementation may allow for adaptive loop bandwidth of the loop filters in a PLL. In addition, the jitter exhibited by a given implementation may be maintained within a given specification of, for example, a SONET standard.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A phase-locked loop (PLL) comprising:
    a phase detector (PD) adapted to generate an up/down signal based on a phase difference between a data signal, a clock signal, and one or more phase-shifted clock signals input to the PD, wherein the phase difference is generated by sampling each clock signal by the data signal and a level of the up/down signal is based on the phase difference;
    a first charge pump adapted to generate a feedback voltage from the up/down signal; and
    a voltage-controlled oscillator (VCO) adapted to generate the clock signal based upon the feedback voltage.

2. The invention as recited in claim 1, wherein the phase detector samples the clock signal with the data signal to generate a first correction signal and samples each phase-shifted clock signal with the data signal to generate a corresponding correction signal, and wherein the phase detector comprises a combiner adapted to generate the up/down signal based on one or more of the correction signals.

3. The invention as recited in claim 2, wherein the combiner includes a second charge pump adapted to combine each correction signal into the up/down signal, the second charge pump coupled, in parallel, with the first charge pump.

4. The invention as recited in claim 2, wherein the phase detector includes at least two flip-flops, each flip-flop adapted to sample either the clock signal or a phase-shifted clock signal with the data signal.

5. The invention as recited in claim 1, wherein the phase detector is a bang-bang phase detector.

6. The invention as recited in claim 1, wherein the phase detector includes at least one delay, each delay receiving the clock signal and generating a corresponding phase-shifted clock signal.

7. The invention as recited in claim 6, wherein the level of the up/down signal is selected from a plurality of levels, each level corresponding to a different range of phase difference between the data signal and the clock signal.

8. The invention as recited in claim 1, wherein the PD is further adapted to generate a retimed data signal based on the clock signal, wherein the retimed data signal is generated by the PD by sampling of the data signal by the clock signal.

9. The invention as recited in claim 1, wherein the PLL is embodied in an integrated circuit.

10. A method of implementing a phase-locked loop (PLL) comprising the steps of:
    (a) generating, by a phase detector (PD), an up/down signal based on a phase difference between a data signal, a clock signal, and one or more phase-shifted clock signals input to the PD, wherein the phase difference is generated by the step of sampling each clock signal by the data signal and a level of the up/down signal is based on the phase difference;
    (b) generating a feedback voltage based on the up/down signal;
    (e) generating, with a voltage-controlled oscillator (VCO), the clock signal based upon the feedback voltage.

11. The invention as recited in claim 10, wherein step (a) comprises the steps of i) sampling, by the the PD, the clock signal with the data signal to generate a first correction signal and ii) sampling each phase-shifted clock signal with the data signal to generate a corresponding correction signal, and wherein the PD comprises a combiner adapted to generate the up/down signal based on one or more of the correction signals.

12. The invention as recited in claim 10, wherein, for step (a), the PD is a bang-bang phase detector.

13. The invention as recited in claim 10, wherein, for step (a) the PD includes at least one delay, each delay receiving the clock signal and generating a corresponding phase-shifted clock signal.

14. The invention as recited in claim 13, wherein the method comprises the step of selecting the level of the up/down signal from a plurality of levels, each level corresponding to a different range of phase difference between the data signal and the clock signal.

15. The invention as recited in claim 10, wherein the method further comprises the step of generating, by the PD, a retimed data signal based on the clock signal, wherein the retimed data signal is generated by the PD by the step of sampling of the data signal by the clock signal.

16. The invention as recited in claim 10, wherein the method is embodied as steps by a processor of an integrated circuit.

* * * * *